United States Patent
Bhattacharyya et al.

(10) Patent No.: US 6,985,381 B2
(45) Date of Patent: Jan. 10, 2006

(54) SYSTEM AND METHOD FOR READING MAGNETIZATION ORIENTATION OF MRAM CELLS

(75) Inventors: Manoi K. Bhattacharyya, Cupertino, CA (US); Thomas C. Anthony, Sunnyvale, CA (US); Anthony P. Holden, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 135 days.

(21) Appl. No.: 10/686,271

(22) Filed: Oct. 15, 2003

(65) Prior Publication Data

US 2005/0083733 A1    Apr. 21, 2005

(51) Int. Cl.
*G11C 11/00*    (2006.01)

(52) U.S. Cl. ............... 365/158; 365/171; 365/173; 365/199; 365/213

(58) Field of Classification Search ............... 365/158, 365/171, 173, 199, 213
See application file for complete search history.

(56) References Cited

U.S. PATENT DOCUMENTS

| | | | |
|---|---|---|---|
| 5,448,515 A * | 9/1995 | Fukami et al. ............... 365/171 |
| 6,256,222 B1 * | 7/2001 | Sakakima et al. .......... 365/158 |
| 6,317,375 B1 | 11/2001 | Perner |
| 6,363,000 B2 | 3/2002 | Perner et al. |
| 6,385,079 B1 | 5/2002 | Tran |
| 2004/0062117 A1 * | 4/2004 | Perner et al. ............... 365/209 |

* cited by examiner

*Primary Examiner*—VanThu Nguyen

(57) ABSTRACT

A method for reading the magnetization orientation of a memory cell includes applying a magnetic field to the memory cell, observing any change in resistance of the memory cell as the magnetic field is applied, and determining the magnetization orientation based upon the observed change in resistance of the memory cell.

27 Claims, 9 Drawing Sheets

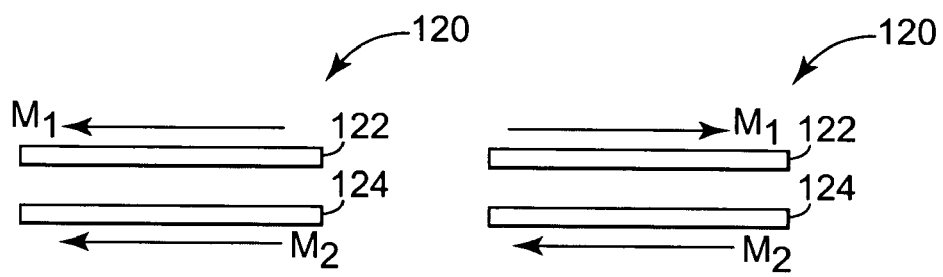
Fig. 2b
(PRIOR ART)
Fig. 2c
(PRIOR ART)
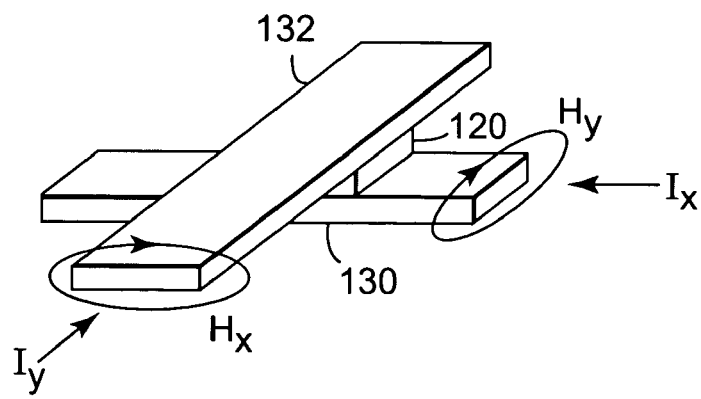
Fig. 3
(PRIOR ART)

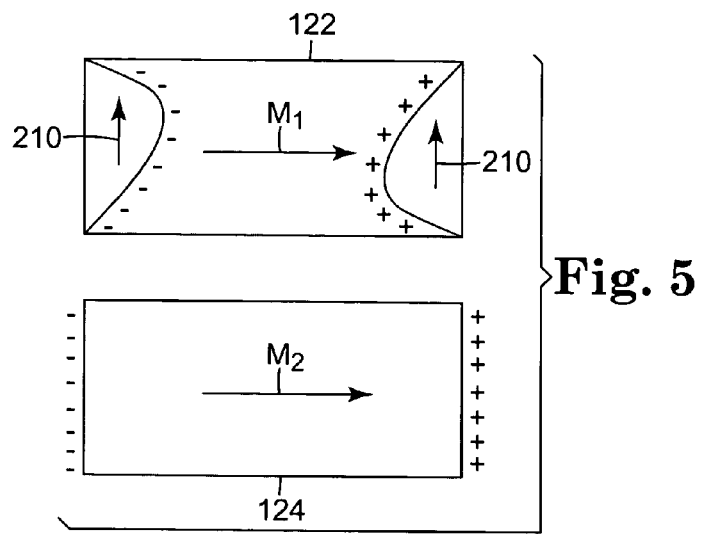
Fig. 5
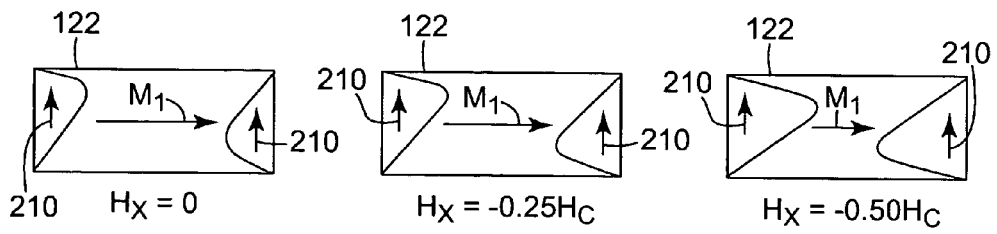
Fig. 6a  Fig. 6b  Fig. 6c

$H_X = 0$ $H_X = 0.25 H_C$ $H_X = 0.50 H_C$

SYSTEM AND METHOD FOR READING MAGNETIZATION ORIENTATION OF MRAM CELLS

THE FIELD OF THE INVENTION

The present invention generally relates to magnetic memory cells. More particularly, the present invention relates to a method for reading the magnetization orientation of such devices.

BACKGROUND OF THE INVENTION

Magnetic random access memory (MRAM) is a non-volatile thin-film memory that is used for data storage. A typical MRAM device includes an array of memory cells. Conductive traces (commonly referred to as word lines and bit lines) are routed across the array of memory cells. Word lines extend along rows of the memory cells, and bit lines extend along columns of the memory cells. Each memory cell is located at a cross point of a word line and a bit line, and stores a single bit of information.

The memory cells may be magnetic memory cells, such as spin dependent tunneling junctions. A typical magnetic memory cell includes a layer of ferromagnetic film in which the magnetization orientation is alterable (referred to as a sense layer or a data storage layer), and a layer of ferromagnetic film in which the magnetization orientation is fixed in a particular direction (referred to as a reference layer or a pinned layer). An insulating tunnel barrier is sandwiched between the ferromagnetic layers.

A logic value may be written to a magnetic memory cell by applying a magnetic field that sets the relative orientations of the memory cell's sense layer and reference layer to either parallel (logic "0") or anti-parallel (logic "1"). The magnetization orientation in the sense layer aligns along an axis of the sense layer that is commonly referred to as its easy axis. External magnetic fields are applied to flip the magnetization orientation in the sense layer along its easy axis to either a parallel or an anti-parallel orientation with respect to the magnetization orientation of the reference layer, depending on the desired logic state. The magnetization orientation of each memory cell will thus assume one of two stable orientations at any given time (i.e., parallel or anti-parallel). The parallel or anti-parallel orientation of the memory cell's ferromagnetic layers determines the resistance state of the memory cell, with a parallel orientation corresponding to a low resistance state, and an anti-parallel orientation corresponding to a high resistance state.

The external magnetic fields used to flip the magnetization orientation of the sense layer in a selected memory cell are created by supplying current to the word line and the bit line crossing the selected memory cell. The currents in the word line and bit line create magnetic fields that, when combined, can switch the magnetization orientation of the selected memory cell from parallel to anti-parallel or vice versa. Other unselected memory cells receive only a single magnetic field from either the word line or the bit line crossing the unselected memory cells. The magnitudes of the magnetic fields are chosen to be low enough so that the unselected memory cells do not switch their magnetization orientations when subjected to a single magnetic field from either the word line or the bit lines. An undesired switching of a memory cell that is subject only to the word line magnetic field or the write line magnetic field is commonly referred to as half-select switching.

As noted above, the logic value stored in a magnetic memory cell is determined by the parallel or anti-parallel orientation of the memory cell. Also, the parallel or anti-parallel orientation of the memory cell determines the resistance state of the memory cell. Thus, the logic value stored in the memory cell may be read by sensing the resistance state of the memory cell. However, the absolute difference between the resistance of a memory cell having a parallel orientation and the resistance of a memory cell having an anti-parallel orientation may be very small. Therefore, the act of measuring the resistance (i.e., reading the data in the memory cell) can itself introduce some uncertainty into the accuracy of the measurement. The act of measuring the resistance may also alter the magnetization orientation of the memory cell. If the magnetization orientation of the memory cell is altered (i.e., the reading operation is destructive), the data must also be written back into the memory cell after the data is read.

SUMMARY OF THE INVENTION

The present invention provides a method for reading the magnetization orientation of a memory cell. In one embodiment according to the invention, the method comprises applying a magnetic field to the memory cell, observing any change in resistance of the memory cell as the magnetic field is applied, and determining the magnetization orientation based upon the observed change in resistance of the memory cell.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIGS. 2a through 2c are profile and side views of a prior art MRAM memory cell illustrating an orientation of magnetization of active and reference magnetic films.

FIG. 3 is a profile view of a prior art memory cell, its write lines, and magnetic fields generated by currents flowing through the write lines.

FIG. 5 is an illustration of magnetic fields in a memory cell whose magnetization orientation can be read according to embodiments of the invention, the memory cell displaying a parallel magnetization orientation.

FIGS. 6a–6c are illustrations of magnetic fields in the sense layer of a memory cell whose magnetization orientation can be read according to embodiments of the invention, the illustrated magnetization orientation moving progressively from a parallel orientation toward an anti-parallel orientation as the magnetic field strength increases toward a critical value.

DETAILED DESCRIPTION

Figure 1A:
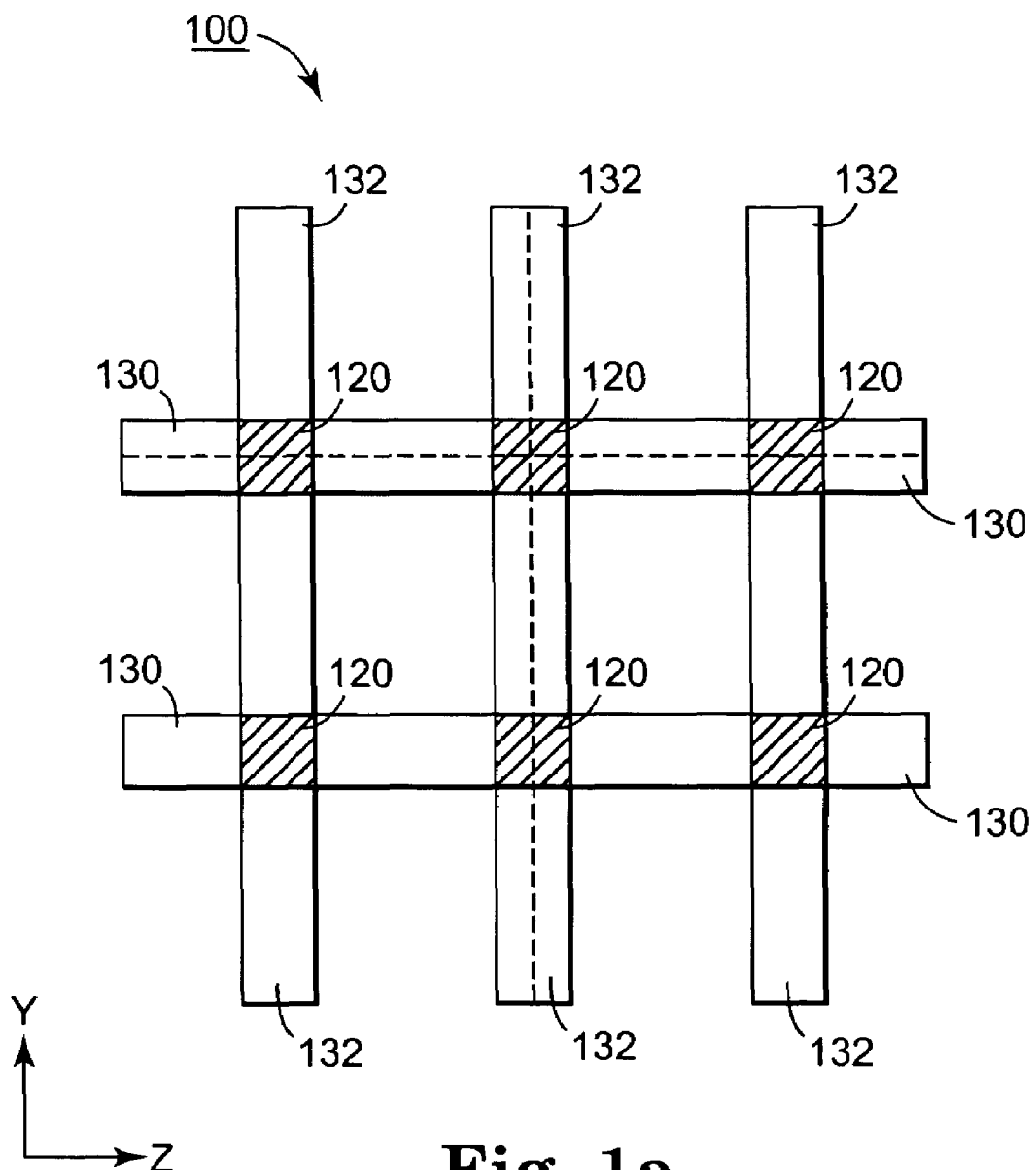
FIGS. 1a and 1b are top and profile views of a prior art MRAM array.
Figure 1B:
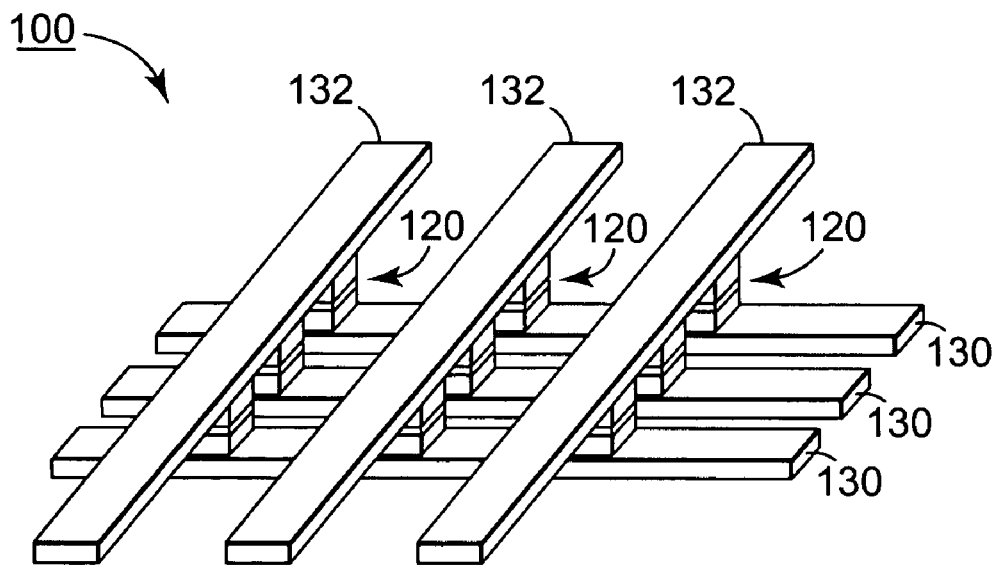

FIG. 1 illustrates a top plan view of a simplified prior art MRAM array 100. The array 100 includes memory cells 120, word lines 130, and bit lines 132. The memory cells 120 are positioned at each intersection of a word line 130 with a bit line 132. Most commonly, the word lines 130 and bit lines 132 are arranged in orthogonal relation to one another. The memory cells 120 are positioned between the word and bit lines 130,132, as illustrated in FIG. 1b. For example, the bit lines 132 can be positioned above the memory cells 120 and the word lines 130 can be positioned below. Because the word lines and the bit lines operate in combination to switch the magnetization orientation of the selected memory cell (i.e., to write the memory cell), the word lines and bit lines can be collectively referred to as write lines.

Figure 2A:
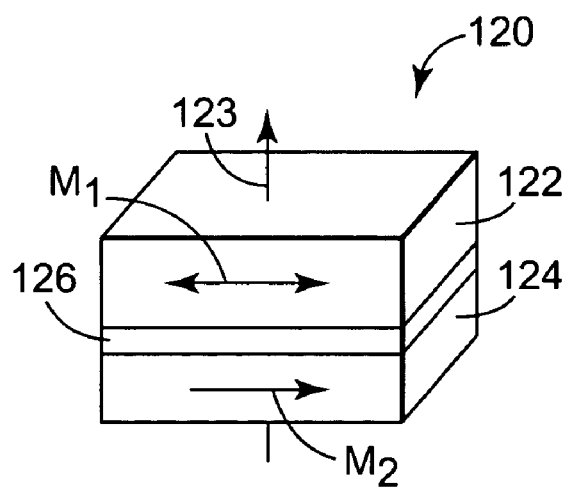

FIGS. 2a through 2c illustrate the storage of a bit of data in a single memory cell 120. In FIG. 2a, the memory cell 120 includes a sense layer 122 and a reference layer 124 which are separated by a dielectric region 126. The magnetization orientation in the sense layer 122 is not fixed and can assume either of two stable orientations as shown by arrow $M_1$. On the other hand, the reference layer 124 has a fixed magnetization orientation shown by arrow $M_2$. The sense layer 122 rotates its magnetization orientation in response to electrical currents applied to the write lines (130,132, not shown) during a write operation to the memory cell 120. The first logic state of the data bit stored in memory cell 120 is indicated when $M_1$ and $M_2$ are parallel to each other as illustrated in FIG. 2b. For instance, when $M_1$ and $M_2$ are parallel a logic "0" state is stored in the memory cell 120. Conversely, a second logic state is indicated when $M_1$ and $M_2$ are anti-parallel to each other as illustrated in FIG. 2c. Similarly, when $M_1$ and $M_2$ are anti-parallel a logic "1" state is stored in the memory cell 120. In FIGS. 2b and 2c the dielectric region 126 has been omitted. Although FIGS. 2a through 2c illustrate the sense layer 122 positioned above the reference layer 124, the reference layer 124 can be positioned above the sense layer 122.

The resistance of the memory cell 120 differs according to the relative orientations of $M_1$ and $M_2$. When $M_1$ and $M_2$ are anti-parallel, i.e., the logic "1" state, the resistance of the memory cell 120 is at its highest. On the other hand, the resistance of the memory cell 120 is at its lowest when the orientations of $M_1$ and $M_2$ are parallel, i.e., the logic "0" state. As a consequence, the logic state of the data bit stored in the memory cell 120 can be determined by measuring its resistance. The resistance of the memory cell 120 is reflected by a magnitude of a sense current 123 (referring to FIG. 2a) that flows in response to read voltages applied to the word and bit lines 130,132.

In FIG. 3, the memory cell 120 is positioned between the write lines 130,132. The separate sense and reference layers 122, 124 are not shown in FIG. 3. The magnetization orientation of the memory cell 120 is altered in response to a current $I_x$ that generates a magnetic field $H_y$ and a current $I_y$ that generates a magnetic field $H_x$. The magnetic fields $H_x$ and $H_y$ act in combination to rotate the magnetization orientation of the memory cell 120.

Figure 4:
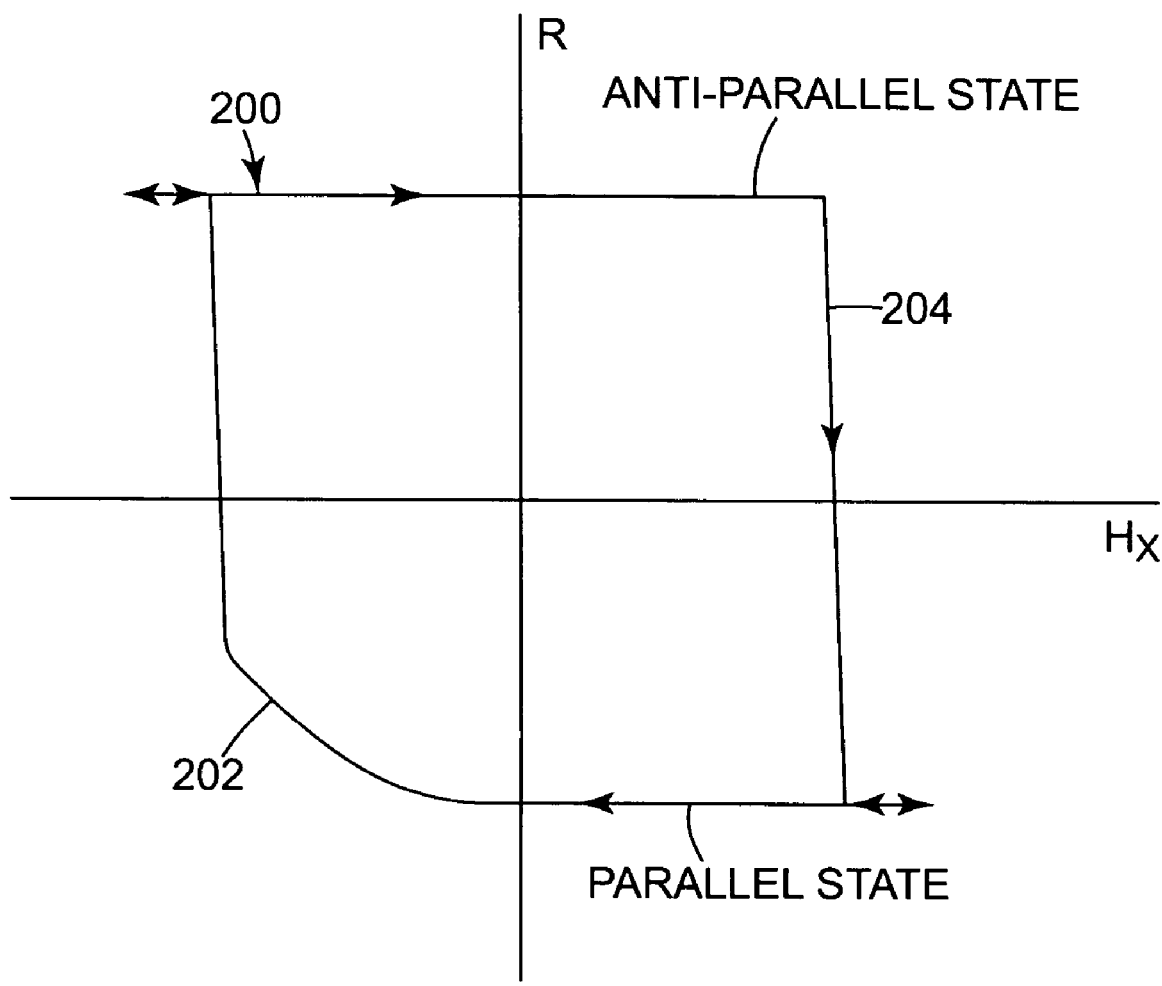
FIG. 4 is an example of a hysteresis loop showing resistance versus applied magnetic field in a memory cell whose magnetization orientation can be read according to embodiments of the invention.

As can be seen from FIG. 4, as the magnetization orientation of the memory cell 120 changes from one magnetization orientation to another (i.e., parallel to anti-parallel or anti-parallel to parallel), a plot of the memory cell resistance R versus the applied magnetic field H follows a hysteresis loop 200. The shape of the resistance R versus magnetic field Hx plot is different, depending on whether the memory cell 120 is going from low resistance (parallel state) to high resistance (anti-parallel state), or from high resistance to low resistance. Specifically, the change from a high resistance to a low resistance is more abrupt than the change from a low resistance to a high resistance. This shape difference of the hysteresis loop 200 may be exploited to read the data in the memory cell 120 with a high degree of accuracy, without altering the resistance state (and thus the data) stored in the memory cell 120.

The reason for the shape of the hysteresis loop 200 can be better understood by examining the magnetization orientations of the sense layer 122 and reference layer 124 in memory cell 120 as the memory cell orientation switches from parallel (low resistance) to anti-parallel (high resistance) and from anti-parallel to parallel. In FIG. 5, a parallel magnetization orientation of $M_1$ in sense layer 122 and $M_2$ in reference layer 124 is illustrated. For purposes of explanation and clarity, in FIG. 5 top views of sense layer 122 and reference layer 124 are illustrated side-by-side and separately, although in actuality they would be stacked on top of each other. As illustrated in FIG. 5, in a parallel state, sense layer 122 and reference layer 124 both have similar net charges on the same sides of the layers (e.g., a net negative charge on the left hand side and a net positive charge on the right hand side).

In a parallel magnetization orientation state of memory cell 120, as shown in FIG. 5, the net magnetic charges of sense layer 122 and reference layer 124 force the formation of edge domains 210 in sense layer 122. As a negative magnetic field Hx (i.e. a field forcing the magnetic field $M_1$ of sense layer 122 to an anti-parallel orientation) is applied to sense layer 122, the edge domains 210 slowly grow until negative magnetic field Hx reaches a critical strength and the magnetization orientation of $M_1$ in sense layer 122 abruptly switches direction to an anti-parallel state. This effect is illustrated in FIGS. 6a–6c, in which only sense layer 122 is shown. In FIG. 6a, the applied magnetic field Hx is 0. In FIG. 6b, the applied magnetic field Hx is −0.25Hc, where Hc is the critical magnetic field that will cause the magnetization orientation of $M_1$ in sense layer 122 to switch direction to an anti-parallel state. In FIG. 6c, the applied magnetic field Hx is −0.50Hc. As the magnitude of the applied magnetic field Hx grows toward the critical magnetic field Hc, edge domains 210 continue to grow toward the center of sense layer 122, until total reversal of the magnetization orientation of $M_1$ in sense layer 122 occurs. As illustrated by portion 202 of hysteresis loop 200 in FIG. 4, the parallel to anti-parallel reversal of the magnetization orientation of $M_1$ in sense layer 122 may be characterized by a gradual and then increasingly rapid change from low resistance to high resistance as the magnitude of the negative magnetic field is increased. After the magnitude of the applied magnetic field Hx surpasses the critical magnetic field Hc, any further increase in the magnitude of the magnetic field has no effect on the resistance R.

Figure 7:
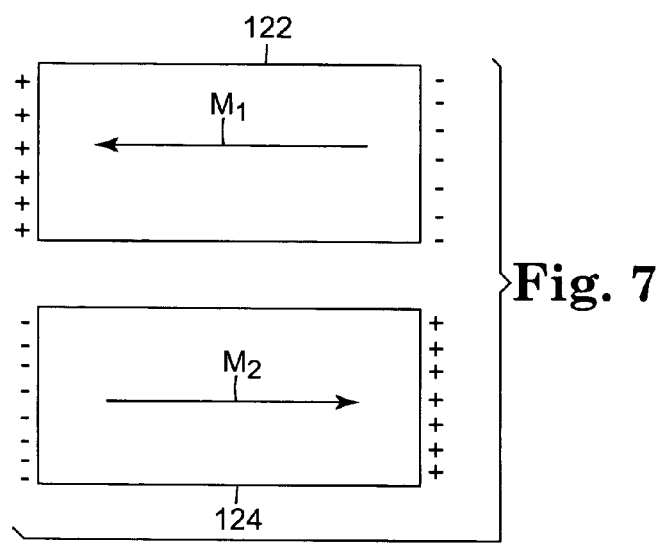
FIG. 7 is an illustration of magnetic fields in a memory cell whose magnetization orientation can be read according to embodiments of the invention, the memory cell displaying an anti-parallel magnetization orientation.

For comparison, in FIG. 7 an anti-parallel magnetization orientation of $M_1$ in sense layer 122 and $M_2$ in reference layer 124 is illustrated. For purposes of explanation and clarity, in FIG. 7 top views of sense layer 122 and reference layer 124 are illustrated side-by-side and separately, although in actuality they would be stacked on top of each other. As illustrated in FIG. 7, in an anti-parallel state, sense layer 122 and reference layer 124 have different net charges on the sides of the layers (e.g., reference layer 124 has a net negative charge on its left hand side and a net positive charge on its right hand side, while sense layer 122 has a net positive charge on its left hand side and a net negative charge on its right hand side).

Figure 8A:
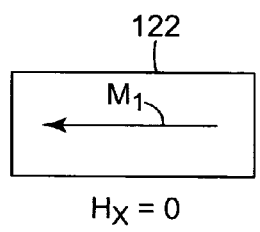
FIGS. 8a–8c are illustrations of magnetic fields in the sense layer of a memory cell whose magnetization orientation can be read according to embodiments of the invention, the illustrated magnetization orientation remaining unmoved from an anti-parallel orientation toward a parallel orientation at magnetic strengths less than a critical value.
Figure 8B:
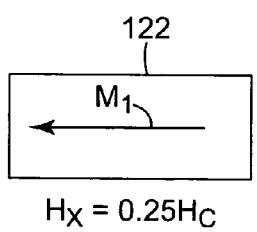
Figure 8C:
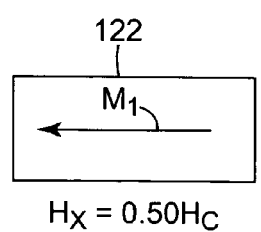

In an anti-parallel magnetization orientation state of memory cell 120, as shown in FIG. 7, the net magnetic charges of sense layer 122 and reference layer 124 effectively cancel each other and no edge domains are formed in sense layer 122. As a positive magnetic field Hx (i.e. a field forcing the magnetic field of sense layer to a parallel orientation) is applied to sense layer 122, no effect is seen in the magnetic orientation of $M_1$ in sense layer 122. Only when magnetic field Hx reaches a critical strength Hc will the magnetization orientation of $M_1$ in sense layer 122 abruptly switches direction to a parallel state. This effect is illustrated in FIGS. 8a–8c, in which only sense layer 122 is shown. In FIG. 8a, the applied magnetic field Hx is 0. In FIG. 8b, the applied magnetic field Hx is 0.25Hc, where Hc is the critical magnetic field that will cause the magnetization orientation of $M_1$ in sense layer 122 to switch direction to a parallel state. In FIG. 8c, the applied magnetic field Hx is 0.50Hc. In contrast to the gradual parallel to anti-parallel switch illustrated in FIGS. 6a–6c, in the anti-parallel to parallel switch illustrated in FIGS. 8a–8c as the applied magnetic field Hx grows toward the critical magnetic field Hc, no effect is seen in the magnetization orientation of $M_1$ in sense layer 122 (or in the resistance of memory cell 120) until magnetic field Hx reaches a critical strength Hc. When the magnetic field reaches the critical strength Hc, the magnetization orientation of $M_1$ in sense layer 122 abruptly switches direction to a parallel state. As illustrated by portion 204 of hysteresis loop 200 in FIG. 4, the anti-parallel to parallel reversal of the magnetization orientation of $M_1$ in sense layer 122 may be characterized by a sudden change from high resistance to low resistance (i.e., a step transition) as the magnitude of the positive magnetic field is increased. After the magnitude of the applied magnetic field Hx surpasses the critical magnetic field Hc, any further increase in the magnitude of the magnetic field has no effect on the resistance R.

Figure 9A:
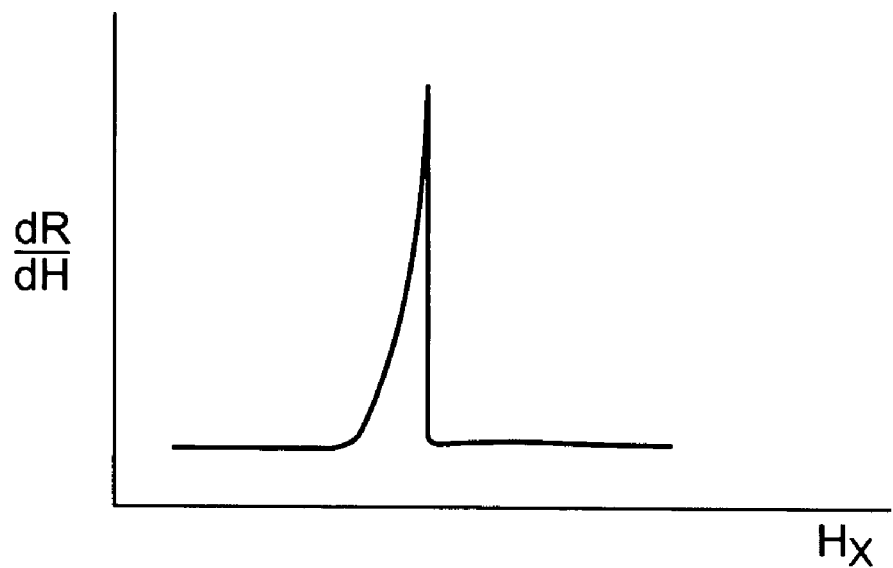
FIG. 9a illustrates δR/δH of the hysteresis loop of FIG. 4, as the magnetization orientation of the memory cell changes from anti-parallel to parallel, which is used by embodiments of the invention for reading the magnetization orientation of the memory cell.
Figure 9B:
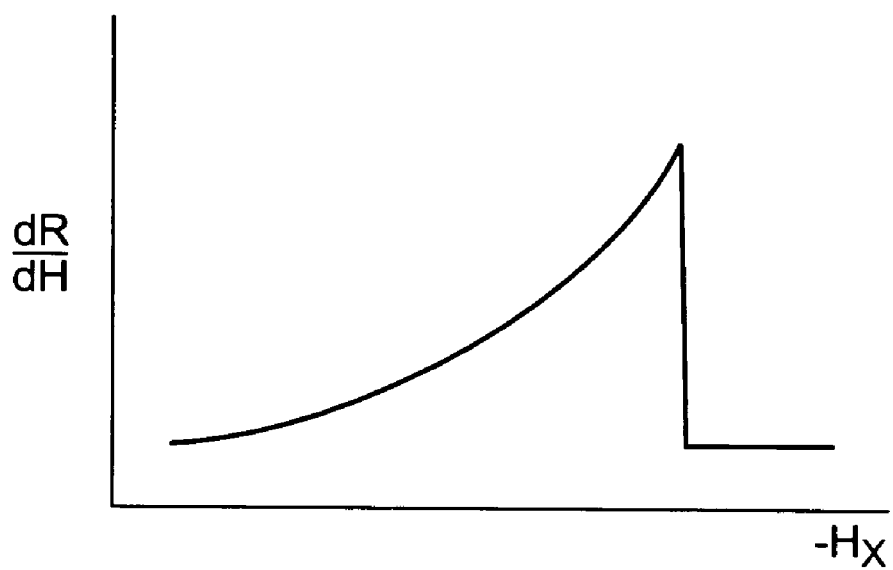
FIG. 9b illustrates δR/δH of the hysteresis loop of FIG. 4, as the magnetization orientation of the memory cell changes from parallel to anti-parallel, which is used by embodiments of the invention for reading the magnetization orientation of the memory cell.
Figure 10A:
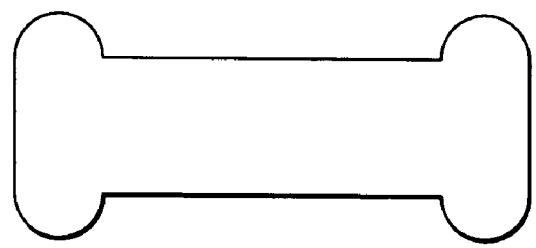
FIGS. 10a–10d are exemplary shapes of a memory cell sense layer which enhance the edge domain effect in a memory cell whose magnetization orientation can be read according to embodiments of the invention.
Figure 10B:
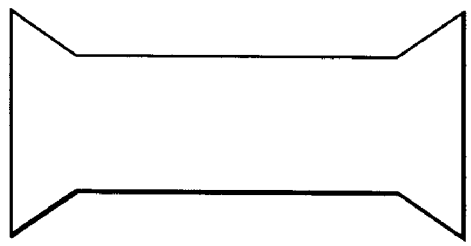
Figure 10C:
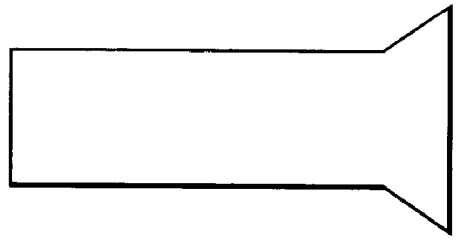
Figure 10D:
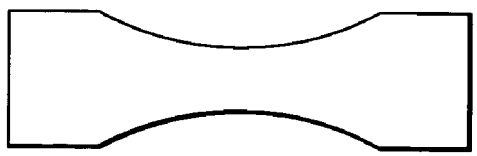

In one embodiment according to the invention, an electric current is supplied to one or both of write lines 130, 132 to create a magnetic field Hx. The resistance R of memory cell 120 is measured at a plurality of values of magnetic field Hx, and curves depicting the rate of change of the resistance R with changing magnetic field strength Hx (hereinafter "δR/δH curves") for the memory cell 120 are determined. The measured δR/δH curves are compared to model curves as illustrated in FIGS. 9a and 9b. The model δR/δH curves of FIGS. 9a and 9b are derivatives of the hysteresis loop 200 in FIG. 4, and reflect the non-symmetrical shape of hysteresis loop 200. FIG. 9a shows δR/δH as the memory cell 120 transitions from an anti-parallel state to a parallel state (portion 204 of hysteresis curve 200), while FIG. 9b shows δR/δH as a memory cell 120 transitions from a parallel state to an anti-parallel state (portion 202 of hysteresis curve 200).

As can be seen, the model δR/δH curves of FIGS. 9a and 9b are significantly different from each other, and can convey more conclusive information about the magnetization orientation of a memory cell than simple resistance measurements. If the measured δR/δH curve is similar to the model curve shown in FIG. 9a, the memory cell 120 is at a high resistance (i.e., anti-parallel) state, and the data stored in the memory cell is a logic value of "1". If the measured δR/δH curve is similar to the model curve shown in FIG. 9b, the memory cell 120 is at a low resistance (i.e., parallel) state, and the data stored in the memory cell is a logic value of "0".

To obtain complete measured δR/δH curves, it is necessary to measure resistance R at magnetic field Hx values around the expected critical magnetic field Hc. As discussed above, if the magnitude of Hx exceeds Hc, the measurements will alter the magnetization orientation of memory cell 120 (i.e., destructively read memory cell 120), and thus require that memory cell 120 be rewritten after its magnetization orientation is determined. Such rewriting of the memory cell 120 is not necessarily problematic, except in so far as it requires an additional step in the reading of data from the memory cell. In some instances, however, it is desirable if memory cell 120 is not destructively read, and thus rewriting of memory cell 120 is not required.

In another embodiment according to the invention, only partial δR/δH curves are obtained. In particular, resistance R is measured at magnetic field Hx values which are selected to avoid exceeding Hc, such that the magnetization orientation of the memory cell 120 is not altered. As illustrated in FIGS. 9a and 9b, even for values of Hx that will not alter the magnetization orientation of the memory cell 120, the shape of the δR/δH curves are different enough from each other to allow comparison of the partial measured δR/δH curves against the model curves of FIGS. 9a and 9b.

Measuring the absolute resistance values of a memory cell to create either complete or partial δR/δH curves can be difficult, particularly when the change from parallel orientation to anti-parallel orientation or vice versa is not complete (such as along curved portion 202 of hysteresis loop 200 in FIG. 4). The ability to determine the magnetization orientation of a memory cell without having to measure absolute resistance values or absolute changes in resistance (as is necessary to determine δR/δH curves) is desirable.

In another embodiment according to the invention, the magnetization orientation of memory cell 120 is determined without the need for measuring the absolute resistance values or absolute change in resistance values of the memory cell to create either complete or partial δR/δH curves, and without risk of altering the magnetization orientation of the memory cell (i.e., a non-destructive read operation). In this embodiment according to the invention, only a relative change in the memory cell resistance R need be observed. Referring to the hysteresis loop 200 of FIG. 4, it can be seen that if there is any change in resistance of the memory cell under the application of a magnetic field Hx (either positive or negative) having a magnitude less than the critical magnetic field Hc, then memory cell 120 is in the parallel state. If there is no change in the resistance of memory cell 120, then memory cell 120 is in the anti-parallel state. For example, if memory cell 120 is in the parallel state and a negative magnetic field Hx is applied, a small increase in resistance R will be observed; if a positive magnetic field Hx is applied, no change in resistance R will be observed. If, on the other hand, memory cell 120 is in the anti-parallel state and a negative magnetic field Hx is applied, no change in resistance R will be observed; similarly, if a positive magnetic field Hx is applied, no change in resistance R will be observed. Thus, the application of only a negative magnetic field Hx allows determination of the magnetization orientation of memory cell 120 based upon the observed change, if any, in resistance R of memory cell 120.

In one embodiment of the invention, a single conductor (e.g., only one of bit line 132 or word line 130) is energized with an electrical current to create a negative magnetic field Hx around the energized line. The magnitude of the negative magnetic field Hx is kept smaller than the critical magnetic field Hc required to flip the magnetization orientation, so that the magnetization orientation of memory cell 120 is not altered. In one embodiment, the magnitude of Hx is as large as approximately 0.6Hc. As the negative magnetic field Hx is applied, the resistance of memory cell 120 is observed to detect any change in resistance R when the negative magnetic field is applied. As described above, if there is any change in resistance R under the application of a negative magnetic field, then memory cell 120 is in the parallel state. If there is no change in the resistance of memory cell 120, then memory cell 120 is in the anti-parallel state.

In another embodiment according to the invention, the magnetization orientation of memory cell 120 may be determined when both word line 130 and bit line 132 are energized. This method may be used, for example, when one of the lines 130, 132 is being used to write data to a memory cell 120 different from the memory cell 120 being read. Assuming one of word or bit lines 130, 132 is "on" (i.e., supplied with an electric current), the other line is supplied with an electric current to create a negative magnetic field Hx. As described above, the magnitude of magnetic field Hx is kept smaller than the critical magnetic field Hc necessary to flip the magnetization orientation, so that the magnetization orientation of memory cell 120 is not altered. The resistance of memory cell 120 is observed to detect any resistance change when the negative magnetic field is applied. As described above, if there is any resistance change under the application of a negative magnetic field, then memory cell 120 is in the parallel state. If there is no resistance change under the application of a negative magnetic field Hx, then memory cell 120 is in the anti-parallel state.

Whether one or both of write lines 130, 132 are supplied with an electric current to create magnetic fields about the write lines, it is not necessary to know the polarity (positive or negative) of the magnetic field Hx to determine the magnetization orientation of memory cell 120. In one embodiment according to the invention, data may be read (that is, the magnetization orientation may be determined) from a selected memory cell 120 in an array of memory cells by supplying a first current to either one of write lines 130, 132 and creating either a positive or negative magnetic field in the selected write line 130, 132. Memory cell 120 is observed to detect any change in resistance R as the first current is supplied to the selected write line. The first current is then reversed in the selected write line, and memory cell 120 is again observed to detect any change in resistance R as the reversed current is supplied to the selected write line. The magnetization orientation of memory cell 120 may then be determined based on the detected change (if any) in resistance R as the first current and the reversed current are supplied to the selected write line. If no change in resistance R is observed with either the first current or the reversed current, then memory cell 120 is in the anti-parallel state. If a change in resistance R is observed with either the first current or the reversed current, then memory cell 120 is in the parallel state. This same method may also be used if one of write lines 130, 132 is constantly energized, while the other of write lines 130, 132 has its current reversed.

In each of the embodiments according to the invention, sense layer 122 may be designed or shaped to enhance the edge domain effect described above with respect to FIGS. 6a–6c and 8a–8c. In particular, sense layer 122 may be created with shapes similar to those described in FIGS. 10a–10d. The shapes illustrated in FIGS. 10a–10d effectively change the slope of hysteresis loop as the magnetization orientation changes from parallel to anti-parallel, such that the gradual change in resistance occurs over a greater range of the magnetic field.

Figure 11:
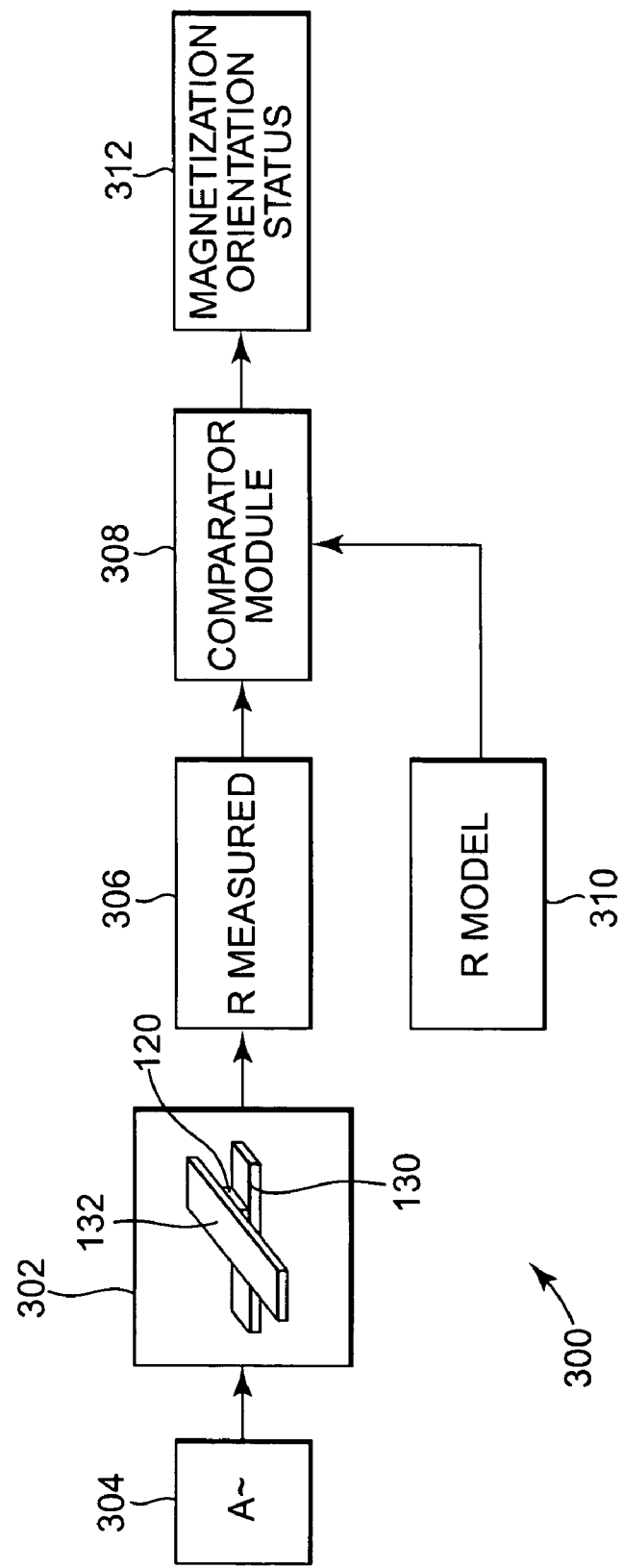
FIG. 11 is a block diagram illustrating one embodiment of a system for implementing the various embodiments for reading the magnetization orientation of a memory cell according to the invention.

One exemplary system 300 for implementing the various embodiments for reading the magnetization orientation of a memory cell is illustrated in FIG. 11. System 300 includes a magnetic memory device 302 having one or more memory cells 120 as described above. Within the magnetic memory device 302, each memory cell 120 is operatively positioned between a conductive word line 130 and a conductive bit line 132. A variable current source 304 is connected to the magnetic memory device 302, such that a current of variable strength and polarity may be independently applied to one or both of the word line 130 and bit line 132 of a selected memory cell 120. The applied current causes a corresponding magnetic field Hx of variable strength and polarity or be applied to selected memory cell 120.

A resistance measurement module 306 is also connected to the magnetic memory device 302, such that the resistance of the selected memory cell 120 can be observed or measured as the strength and/or polarity of the applied current (and thus the applied magnetic field Hx) is varied. Resistance measurement module 306 may be either software, hardware, or a combination of both, and may be capable of determining relative and/or absolute change in the resistance of selected memory cell 120, depending upon which of the various embodiments for reading the magnetization orientation is being implemented.

The observed or measured change in resistance of the selected memory cell 120 as a function of the applied magnetic field Hx strength and/or polarity is supplied to a comparator module 308. Comparator module 308 compares the measured or observed behavior of the resistance of memory cell 120 (obtained from resistance measurement module 306) to a model behavior of a memory cell (represented by box 310). Comparator module 308 may be either software, hardware, or a combination of both. The model behavior of memory cell resistance with change as a function of applied magnetic field can be $\delta R/\delta H$ curves as discussed above with reference to FIGS. 9a and 9b. Alternately, the model behavior of memory cell resistance as a function of applied magnetic field can be a hysteresis loop as discussed above with reference to FIG. 4. Based upon comparison of the measured or observed behavior of memory cell 120 to the model behavior, comparator module 308 determines the status 312 of the magnetic orientation (parallel or anti-parallel) of the selected memory cell 120.

What is claimed is:

1. A method for reading the magnetization orientation of a memory cell, the method comprising:

applying a magnetic field to the memory cell;
observing any change in resistance of the memory cell as the magnetic field is applied; and
determining the magnetization orientation based upon the observed change in resistance of the memory cell, wherein the magnetic field is a negative magnetic field and wherein determining the magnetization orientation includes determining the memory cell is in a parallel magnetization orientation if there is a change in resistance of the memory cell.

2. A method for reading the magnetization orientation of a memory cell, the method comprising:
applying a magnetic field to the memory cell;
observing any change in resistance of the memory cell as the magnetic field is applied; and
determining the magnetization orientation based upon the observed change in resistance of the memory cell, wherein the magnetic field is a negative magnetic field and wherein determining the magnetization orientation includes determining the memory cell is in an anti-parallel magnetization orientation if there is no change in resistance of the memory cell.

3. A method for reading data from a selected memory cell in an array of memory cells, the selected memory cell being positioned between a first write line and a second write line, the method comprising:
supplying a first current in the first write line;
detecting any change in resistance R of the selected memory cell as the first current is supplied to the first write line;
reversing the first current in the first write line;
detecting any change in resistance R of the selected memory cell as the reversed first current is supplied to the first write line; and
determining the magnetization orientation of the selected memory cell based on the detected change in resistance R of the selected memory cell as the first current and the reversed first current are supplied to the first write line.

4. The method of claim 3, wherein supplying the first current does not alter the magnetization orientation of the selected memory cell.

5. The method of claim 3, wherein determining the magnetization orientation of the selected memory cell includes determining a $\delta R/\delta H$ curve for the selected memory cell, where R is the measured resistance and H is the magnetic field strength.

6. The method of claim 5, wherein determining a $\delta R/\delta H$ curve for the selected memory cell includes sampling the resistance of the selected memory cell at a plurality of different magnetic fields about the first line.

7. The method of claim 3, wherein the array of memory cells is a magnetic random access memory device.

8. The method of claim 3, wherein determining the magnetization orientation of the selected memory cell includes determining the memory cell is in a parallel magnetization orientation if there is a change in resistance of the memory cell, and determining the memory cell is in an anti-parallel magnetization orientation if there is no change in resistance of the memory cell.

9. The method of claim 3, further comprising supplying a second current in to second write line while the first current is supplied to the first write line.

10. A method for detecting the magnetization orientation of a memory cell, the memory cell operatively positioned between a first conductor and a second conductor, to method comprising:
creating a first magnetic field about the first conductor;
creating a second magnetic field about the second conductor;
observing changes in the resistance of the memory cell under the influence of the first and second magnetic fields;
replacing the second magnetic field with a third magnetic field; and
observing changes in the resistance of the memory cell under the influence of the first and third magnetic fields.

11. The method of claim 10, wherein the third magnetic field has a polarization direction opposite a polarization direction of the second magnetic field.

12. The method of claim 10, wherein creating a magnetic field about the conductors includes supplying electric currents through the conductors.

13. The method of claim 10, wherein the first and second magnetic fields do not alter the magnetization orientation in the memory cell.

14. The method of claim 10, wherein the first and third magnetic fields do not alter the magnetization orientation in the memory cell.

15. The method of claim 10, wherein observing changes in the resistance of the memory cell includes measuring a $\delta R/\delta H$ curve for the memory cell, where R is the measured resistance and H is the magnetic field strength.

16. The method of claim 15, wherein measuring a $\delta R/\delta H$ curve includes sampling the resistance of the memory cell at a plurality of magnetic fields.

17. The method of claim 10, wherein the memory cell is in an array of memory cells.

18. The method of claim 10, wherein the memory cell is in a magnetic random access memory device.

19. A system for reading the magnetization orientation of a memory cell, the system comprising:
a memory cell operatively positioned between a first conductor and a second conductor;
a current source for applying a variable current to the first conductor and a corresponding variable magnetic field to the memory cell;
a resistance measurement module for measuring change in resistance of the memory cell with change in the applied magnetic field; and
a comparator module for comparing the measured change in resistance with change in applied magnetic field to a model change in resistance with change in applied magnetic field.

20. The system of claim 19, wherein the memory cell is in an array of memory cells.

21. The system of claim 19, wherein the memory cell comprises a sense layer having an alterable magnetization orientation and a reference layer having a fixed magnetization orientation.

22. The system of claim 21, wherein the sense layer is shaped to enhance an edge domain effect of the memory cell.

23. The system of claim 19, wherein the measured and model change in resistance with change in applied magnetic field are $\delta R/\delta H$ curves, where R is the memory cell resistance and H is the magnetic field strength.

24. The system of claim 19, wherein the model change in resistance with change in applied magnetic field is a hysteresis loop.

25. A system for reading the magnetization orientation of a memory cell, the system comprising:
a memory cell operatively positioned between a first conductor and a second conductor;

means for applying a variable current to the first conductor and a corresponding variable magnetic field to the memory cell;

means for measuring change in resistance of the memory cell with change in the applied magnetic field; and means for comparing the measured change in resistance with change in applied magnetic field to a model change in resistance with change in applied magnetic field.

26. The system of claim 25, wherein the measured and model change in resistance with change in applied magnetic field are $\delta R/\delta H$ curves, where R is the memory cell resistance and H is the magnetic field strength.

27. The system of claim 25, wherein the model change in resistance with change in applied magnetic field is a hysteresis loop.

* * * * *

UNITED STATES PATENT AND TRADEMARK OFFICE
CERTIFICATE OF CORRECTION

PATENT NO.         : 6,985,381 B2
APPLICATION NO. : 10/686271
DATED                 : January 10, 2006
INVENTOR(S)        : Manoj K. Bhattacharyya et al.

It is certified that error appears in the above-identified patent and that said Letters Patent is hereby corrected as shown below:

On the title page, item (75), in "Inventors", in column 1, line 1, delete "Manoi" and insert -- Manoj --, therefor.

In column 9, line 62, in Claim 9, delete "to" and insert -- the --, therefor.

In column 9, line 66, in Claim 10, delete "to" and insert -- the --, therefor.

Signed and Sealed this

Tenth Day of November, 2009

David J. Kappos
*Director of the United States Patent and Trademark Office*